(12) United States Patent
Jupudi et al.

(10) Patent No.: US 10,677,830 B2
(45) Date of Patent: Jun. 9, 2020

(54) METHODS AND APPARATUS FOR DETECTING MICROWAVE FIELDS IN A CAVITY

(71) Applicant: APPLIED MATERIALS, INC., Santa Clara, CA (US)

(72) Inventors: Ananthkrishna Jupudi, Singapore (SG); Yueh Sheng Ow, Singapore (SG); Jacob Newman, Palo Alto, CA (US); Preetham Rao, Singapore (SG); Yuichi Wada, Chiba (JP); Vinodh Ramachandran, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 161 days.

(21) Appl. No.: 15/649,600

(22) Filed: Jul. 13, 2017

(65) Prior Publication Data

US 2019/0018053 A1    Jan. 17, 2019

(51) Int. Cl.
*G01R 29/08* (2006.01)
*H01L 21/67* (2006.01)
(Continued)

(52) U.S. Cl.
CPC ..... *G01R 29/0892* (2013.01); *G01R 29/0871* (2013.01); *H01L 21/67115* (2013.01);
(Continued)

(58) Field of Classification Search
CPC .... G01R 29/0892; H05B 6/6467; H05B 6/80; H01L 21/67115
See application file for complete search history.

(56) References Cited

U.S. PATENT DOCUMENTS 4,207,518 A * 6/1980 Hopfer ............... G01R 29/0878
324/119
5,109,595 A    5/1992 Wickersheim et al.
(Continued)

FOREIGN PATENT DOCUMENTS

JP    2006-322869 A    11/2006
JP    2006322869 A * 11/2006
(Continued)

OTHER PUBLICATIONS

Introduction to Light Pipe Technology, available at https://web.archive.org/web/20160615204245/https://www.mouser.com/pdfDocs/Lumex_LightPipeTrainingModule_Part1.pdf on Jul. 15, 2016 (Year: 2016).*
(Continued)

*Primary Examiner* — Daniel R Miller
(74) *Attorney, Agent, or Firm* — Moser Taboada; Alan Taboada

(57) ABSTRACT

An apparatus for relaying microwave field intensity in a microwave cavity. In some embodiments, the apparatus comprises a microwave transparent substrate with at least one Radio Frequency (RF) detector that is capable of detecting a microwave field and generating a signal associated with a field intensity of the detected microwave field and a transmitter that receives the signal associated with the detected microwave field from the RF detector and transmits or stores information about the detected microwave field intensity. In some embodiments, the apparatus relays the microwave intensity via a wired, wireless, or optical transmitter located in proximity of the RF detector.

20 Claims, 3 Drawing Sheets

(51) Int. Cl.
    *H05B 6/80*     (2006.01)
    *H05B 6/64*     (2006.01)

(52) U.S. Cl.
    CPC ..... *H01L 21/67253* (2013.01); *H05B 6/6467* (2013.01); *H05B 6/80* (2013.01); *H05B 6/806* (2013.01)

(56) References Cited

U.S. PATENT DOCUMENTS

| | | | |
|---|---|---|---|
| 5,110,216 | A | 5/1992 | Wickersheim et al. |
| 2003/0075768 | A1 | 4/2003 | Lin et al. |
| 2014/0034636 | A1* | 2/2014 | Yamamoto ........... H05B 6/6402 219/756 |
| 2015/0097561 | A1 | 4/2015 | Desmulliez et al. |
| 2015/0355110 | A1 | 12/2015 | Sappok et al. |
| 2018/0077762 | A1* | 3/2018 | Lindberg-Poulsen ....................... H05B 6/6452 |

FOREIGN PATENT DOCUMENTS

| | | |
|---|---|---|
| JP | 2009-174929 A | 8/2009 |
| JP | 2010-021824 A | 1/2010 |
| KR | 2014-0070253 A | 6/2014 |

OTHER PUBLICATIONS

Luan et al., Frequency Distribution in Domestic Microwave Ovens and Its Influence on Heating Pattern, Journal of Food Science, 2016 (Year: 2016).*
Hewlett Packard Data Sheet, Surface Mount Microwave Schottky Detector Diodes in SOT-323 (SC-70), 1998 (Year: 1998).*
Micro Denshi Hotaru Product Information downloaded from http://www.microdenshi.co.jp/en/device/.
International Search Report and Written Opinion dated Oct. 24, 2018 received for PCT Application No. PCT/US2018/041377.

* cited by examiner

METHODS AND APPARATUS FOR DETECTING MICROWAVE FIELDS IN A CAVITY

FIELD

Embodiments of the present principles generally relate to semiconductor process chambers used in semiconductor manufacturing systems.

BACKGROUND

Microwaves are used, for example, in semiconductor processing to anneal, clean, cure, and degas. The microwaves can be used to process a single wafer and/or multiple wafers in a batch. The microwaves are generated and a waveguide is used to transmit the microwaves into a cavity. The cavity and any wafer supports or other structures inside the cavity affect the distribution of the microwaves. Standing waves can be formed in the cavity or the microwave distribution could be non-uniform. Both standing waves and non-uniformity will have a negative effect on the processing of the wafer in the cavity.

Accordingly, the inventors have developed an improved microwave detector and method of detecting microwaves in a cavity.

SUMMARY

In some embodiments, an apparatus for characterizing microwave energy in a microwave chamber comprises a microwave transparent substrate having at least one Radio Frequency (RF) detector that is capable of detecting a microwave field and generating a signal associated with a field intensity of the detected microwave field and a transmitter that receives the signal associated with the detected microwave field from the RF detector and transmits information about the detected microwave field intensity.

In some embodiments, an apparatus for characterizing microwave energy in a microwave chamber comprises a microwave transparent substrate having at least one Radio Frequency (RF) detector that is capable of detecting a microwave field and generating a signal associated with a microwave field intensity of the microwave field and at least one light emitting diode (LED) electrically coupled to the at least one RF detector, wherein the LED continually emits a visual indication of a microwave field intensity based on the signal associated with the microwave field intensity of the microwave field received from the RF detector.

In some embodiments, a semiconductor processing chamber for processing semiconductors comprises a microwave cavity for processing semiconductor substrates which comprises at least one microwave transparent substrate mounted internally to the microwave cavity, the microwave transparent substrate having at least one Radio Frequency (RF) detector that is capable of detecting a microwave field and generating a signal associated with a microwave field intensity of the microwave field and a transmitter that receives the signal associated with the microwave field from the RF detector and transmits information about the microwave field intensity.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
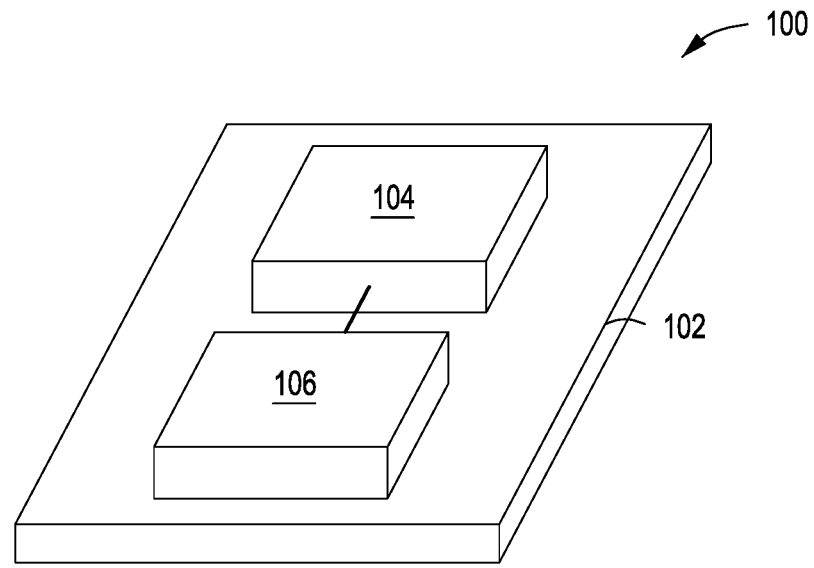
FIG. 1 depicts a microwave intensity detection unit in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Microwaves are used during semiconductor processes to aid in degassing, cleaning, curing, and annealing. In order for these processes to produce uniform results, the microwave field should be uniform within the cavity that the substrate is being processed in. The methods and apparatus based on the present principles advantageously allow for tuning of the microwave fields inside a cavity. In some embodiments, a microwave intensity detection unit (MIDU) is placed inside the cavity to capture the intensity (watts/meter) of the microwave field in the cavity. The MIDU continuously relays information regarding the microwave field intensity. The MIDU can be advantageously used in a cavity with or without a semiconductor substrate that is to be processed. The MIDU can also be permanently incorporated into the microwave cavity. Some embodiments of the MIDU can operate over a frequency range of approximately 2 GHz to 8 GHz. Some embodiments cover smaller frequency bands and some embodiments cover frequencies relevant to the specific microwave cavity in which the MIDU is to be used.

The continuous detection capability of the MIDU advantageously allows detection of the variations of the microwave field intensity over time. Microwave field intensity Information obtained by the MIDU also advantageously allows for semiconductor chamber matching. The MIDU also beneficially provides a way to adjust or remove standing waves from microwave cavities by monitoring the microwave field intensity levels throughout a microwave cavity and making microwave wavelength adjustments. Proper tuning of a microwave cavity (e.g., semiconductor chamber) provides a more uniform microwave field which beneficially provides a more uniform process in the semiconductor chamber.

In some embodiments, as shown in FIG. 1, a MIDU 100 may include a microwave transparent substrate 102 with a radio frequency (RF) detector 104. The RF detector generates a signal based on an intensity of a detected microwave field. The signal can be a voltage based signal and/or a current based signal and the like. In some embodiments, the RF detector may produce a digital signal. In some embodiments, the RF detector may cover an approximately 2 GHz to approximately 8 GHz frequency range. In some embodiments, the RF detector may cover an approximately 2 GHz to approximately 4 GHz frequency range. In other embodiments, the RF detector may cover an approximately 6 GHz to approximately 8 GHz frequency range. The RF detector may continuously generate the microwave field intensity signal. The microwave transparent substrate 102 minimizes the impact that the MIDU may have on the microwave field inside the microwave cavity while the microwave field intensity is being measured.

In some embodiments, the RF detector 104 interfaces with a light emitting diode (LED) 106 and/or other illuminating source such as, for example, an incandescent bulb and the like. The LED 106 provides a source of illumination to indicate visually (a "visual indication") the intensity of the microwave field within the microwave cavity. The LED illumination level is affected by the output signal of the RF detector 104. The amount of illumination from the LED 106 may reflect the magnitude of the intensity of the microwave field detected by the RF detector. The LED 106 continuously varies the illumination based on the generated signal provided by the RF detector. The LED 106 may also operate outside of the visual spectrum such as in the infrared spectrum or other spectrums that may be monitored or recorded by devices such as full spectrum cameras and the like.

In some embodiments, a camera is utilized to monitor or record the illumination provided by the LED 106. The camera can be equipped to capture the illumination in the visual spectrum and/or other spectrums such as, for example, the infrared spectrum. The camera may record the illumination from the LED 106 continuously and in real-time. The camera may also be used to periodically record data. The visual or non-visual spectrum information that is in real-time and/or recorded can be used to tune the microwave cavity to more uniformly distribute the microwave field intensity and/or to match other equipment. After an adjustment to the microwave cavity, the MIDU 100 can capture more microwave field intensity information to verify the adjustments had the proper effect on the microwave fields. In a similar fashion, the MIDU 100 can be used with existing microwave cavities as a health check to verify that the microwave cavities are still operating within the correct parameters.

If a visually transparent panel is available for viewing, the MIDU 100 can also be used with or without the camera. In place of the camera, an operator may watch the microwave field intensity changes of the MIDU 100 during operation of the microwave cavity. If a visually transparent panel is not available for viewing or camera recording, the camera may be placed near or inside the microwave cavity such that the camera's impact on the microwave field in the cavity is negligible or significantly reduced.

In some embodiments, different wavelengths (color spectrums) may be used for the LED illumination. The different wavelengths may be used to distinguish field strengths and/or field frequencies. An array of multiple MIDUs can be mounted to the microwave transparent substrate 102, with one or more of the multiple MIDUs having RF detectors that detect different microwave frequencies. For example, MIDUs having RF detectors that operate at a 2 GHz frequency may illuminate in the green color spectrum while MIDUs having RF detectors that operate at a 4 GHz frequency may illuminate in the blue color spectrum. The multiple detection frequencies allows flexibility to use the array with different microwave cavities operating at different frequencies. The number of MIDUs in an array may also be adjusted depending on the microwave cavity dimensions. In some embodiments, the MIDUs can be non-permanently mounted to the microwave transparent substrate 102, allowing removal and/or installation of the MIDUs for different situations. The non-permanency allows for different configurations to be used in different environments. The different configurations may include adding more or less MIDUs or selecting MIDUs based on the frequency responsiveness of the MIDU for a given task.

Figure 2:
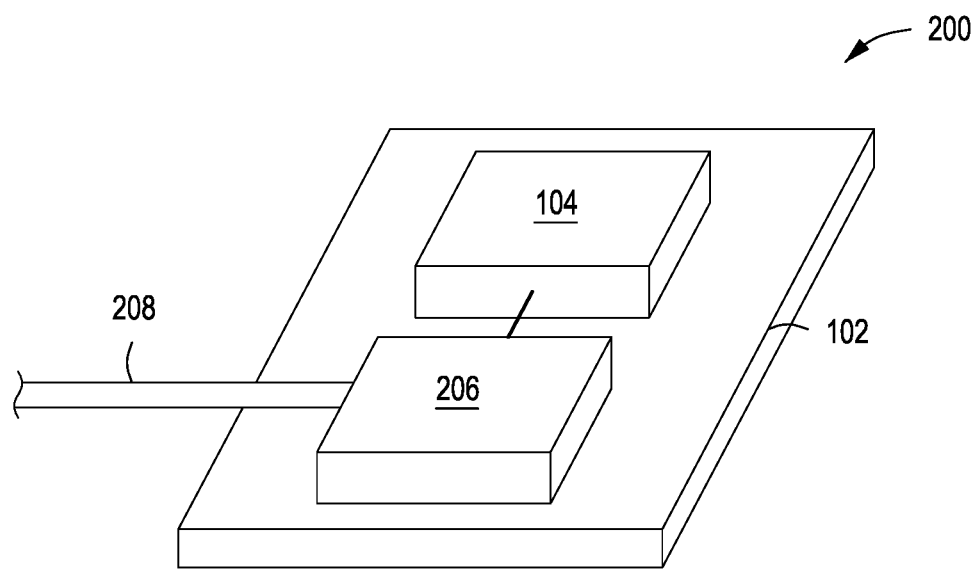
FIG. 2 depicts a wired microwave intensity detection unit in accordance with some embodiments of the present principles.

In some embodiments as depicted in FIG. 2, a MIDU 200 may include the RF detector 104 and a transmitter 206. The transmitter 206 receives the generated signal from the RF detector 104 and relays the signal and/or information about the signal to a remote location. In some embodiments, the transmitter 206 is electrically connected via a transmission cable 208 to an external location. The external location may include a data acquisition unit that receives and records the real-time information relayed by the transmitter 206 over the transmission cable 208. The transmission cable 208 is representative and may be comprised of one or more cables comprised to one transmitter or multiple transmitters. The transmission cable 208 may be routed inside the microwave cavity to an existing port to breach the microwave cavity and reach the remote location.

The transmitter 206 may relay information about the microwave field intensity detected by the RF detector 104 using analog and/or digital signals over the transmission cable 208. In some embodiments, the transmitter 206 may include an amplifier to amplify the signal received from the RF detector 104. The transmitter 206 then relays the amplified signal, in real-time, to a remote location. In some embodiments, the transmitter 206 may include an analog to digital convertor (ADC). The transmitter 206 may convert the signal received from the RF detector into data. Depending on the latency of the conversion process, the transmitter 206 may also time stamp the data before relaying the data over the transmission cable 208 to the remote location. The transmitter 206 may also include an identification (ID) of the RF detector 104, the transmitter 206, and/or a MIDU and the like. The identification information may be sent once at the start or at periodic intervals, or every time data is sent. The ID information may be utilized to determine location of the received microwave field intensity data, especially when MIDUs are used in an array configuration. The location of multiple MIDUs on the microwave transparent substrate 102 can be mapped to locations within the microwave cavity. In some embodiments, a single transmitter may be connected to one more RF detectors. When a single transmitter is used with multiple RF detectors, the ID information of the RF detectors can be used to locate where in the microwave cavity the microwave field intensity data originated.

Figure 3:
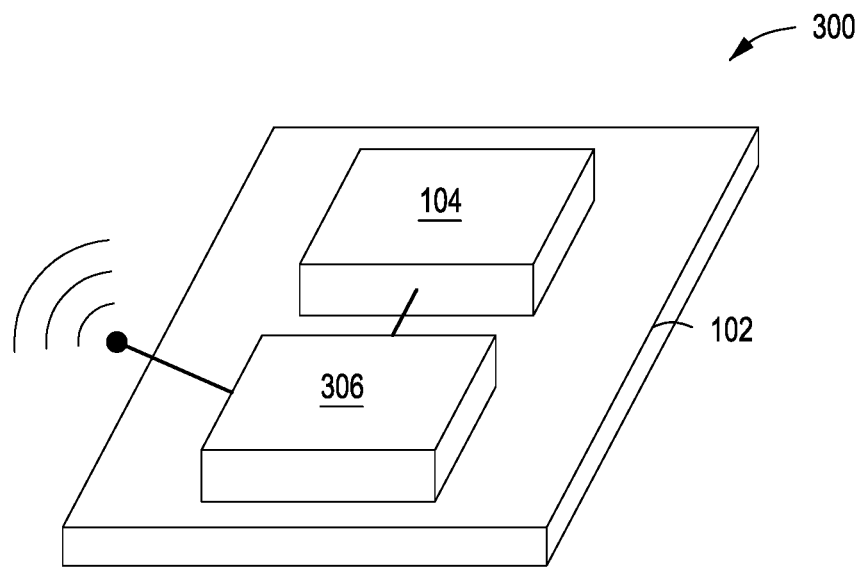
FIG. 3 depicts a wireless microwave intensity detection unit in accordance with some embodiments of the present principles.

In some embodiments, as shown in FIG. 3, a MIDU 300 may include a wireless transmitter 306 that interfaces with the RF detector 104. The wireless transmitter 306 allows the microwave transparent substrate 102 to be located within a microwave cavity without having to breach the cavity with a cable to transmit information about the microwave field intensity. The wireless transmitter 306 relays the microwave field intensity information from the RF detector 104 continuously to a remote location exterior to the microwave cavity and/or to another location in the semiconductor processing equipment housing the microwave cavity. In some embodiments, the MIDU 300 includes an ADC in the wireless transmitter 306 to convert the received signal from the RF detector 104 into data before relaying the information wirelessly. Because the MIDU is wireless, the microwave transparent substrate can be placed anywhere inside the microwave cavity and/or structures located within the microwave cavity such as, for example, a wafer support that may hold wafers during semiconductor processes that use microwaves and the like.

Figure 4:
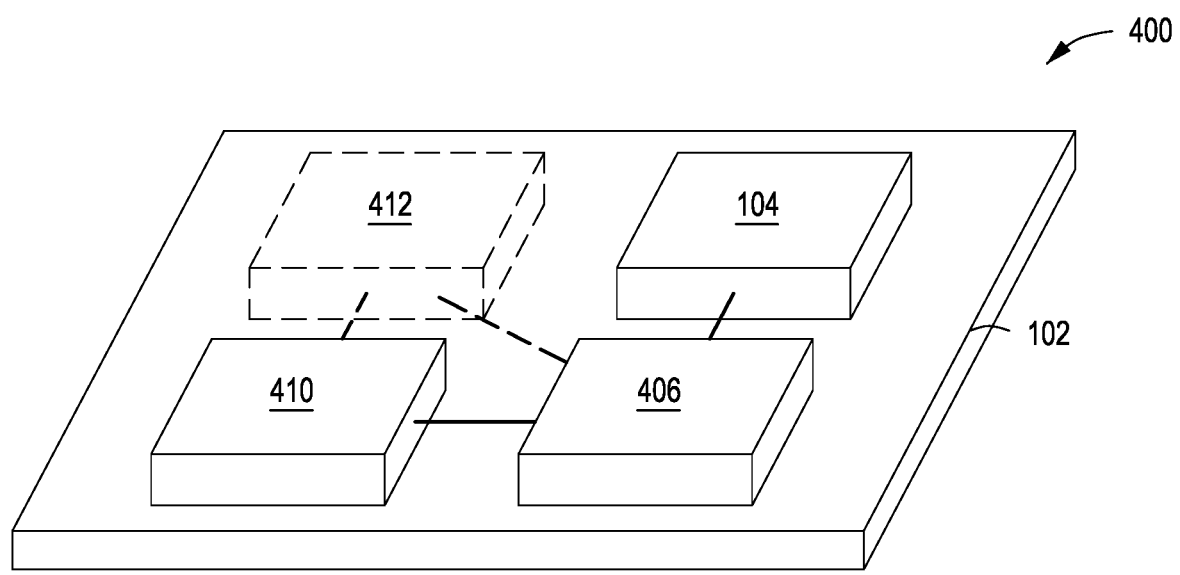
FIG. 4 depicts a microwave intensity detection unit with memory in accordance with some embodiments of the present principles.

In some embodiments, as illustrated in FIG. 4, a MIDU 400 may include the RF detector 104, a transmitter 406, a memory 410, and an optional data port 412. In some microwave cavity environments, wired and wireless transmitters may not be practical. The MIDU 400 includes the memory 410 to store microwave field intensity information for later retrieval. The transmitter 406 typically includes an ADC to convert the signal from the RF detector 104 into data. The transmitter 406 is electrically connected to the memory 410 and stores the data into the memory 410. The transmitter 406 may also time tag the data and/or include ID information (as detailed above) with the data when stored in the memory 410. The memory 410 may be electrically connected to and accessible by a single transmitter or multiple transmitters on the microwave transparent substrate 102. The data is stored on the memory 410 continuously until the MIDU 400 is removed from the microwave cavity. After removal of the MIDU 400 from the cavity, data stored on the memory 410 may be retrieved through the optional data port 412 that is electrically connected to the memory 410 and/or the transmitter 406. In some embodiments, the transmitter 406 may include a wireless function which can be triggered to access data in the memory 410 and relay the retrieved data wirelessly.

Figure 5:
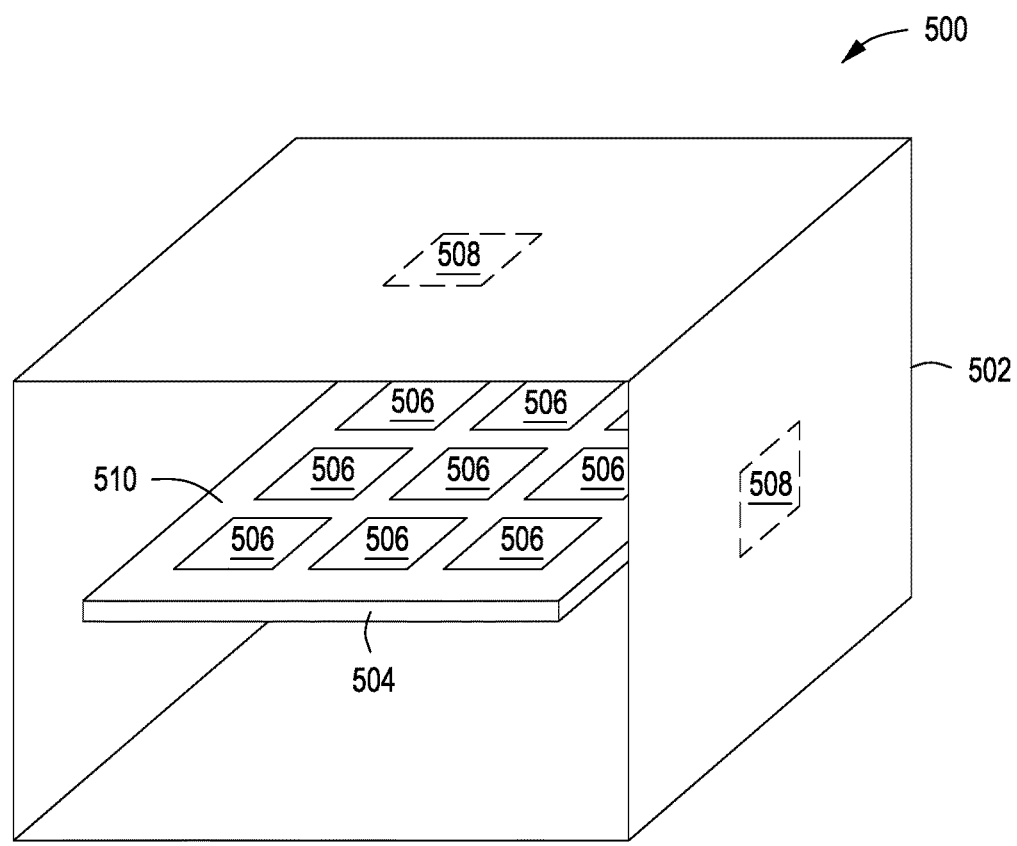
FIG. 5 depicts a microwave intensity detection unit in situ in accordance with some embodiments of the present principles.
Figure 6:
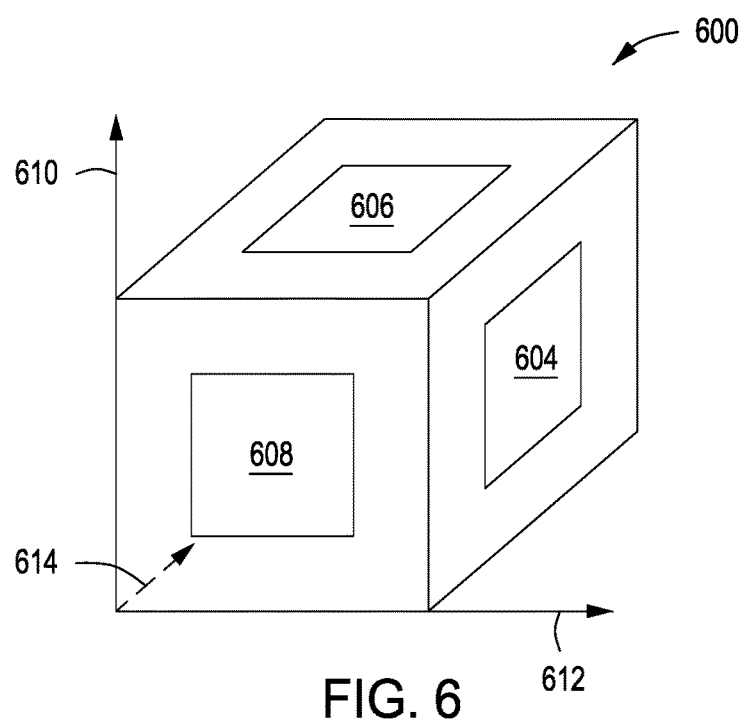
FIG. 6 depicts a three-dimensional microwave intensity detection unit in accordance with some embodiments of the present principles.

FIG. 5 shows a semiconductor processing chamber 500 that has a microwave cavity 502. A MIDU 510 with an array of RF detectors 506 on a microwave transparent substrate 504 is located inside the microwave cavity 502. As the array of RF detectors 506 are exposed to a microwave field, the intensity of the microwave field excites the RF detectors in associated locations which in turn generates microwave field intensity signals from the associated RF detector. The signals are then transmitted and/or stored continuously. The microwave transparent substrate 504 can be oriented in any axis in the microwave cavity 502. FIG. 5 also illustrates optional RF detectors 508 that may be mounted individually within the microwave cavity 502 and/or on or within structures within the microwave cavity, either permanently or temporarily. The optional RF detectors 508 may also include transmitters and/or memory.

In some circumstances, microwave field intensity may be useful when measured in multiple planes at the same time. In some embodiments, a MIDU 600, which is in a cube-like configuration, may include RF detectors 604, 606, 608 on one or more different sides of the MIDU 600. The RF detectors 604, 606, 608 are mounted on a microwave transparent material 602 with three dimensions. The three dimensions may be unequal in length. The RF detector 604 detects microwave fields that are incident to the Y 610/Z 614 plane. The RF detector 606 detects microwave fields that are incident to the X 612/Z 614 plane. The RF detector 608 detects microwave fields that are incident to the X 612/Y 610 plane. In some embodiments, multiple RF detectors are mounted on one or more sides of the microwave transparent material 602. In some embodiments, at least one RF detector receives microwave fields in at least two dimensions. In some embodiments, memory and/or transmitters may be mounted internally to the microwave transparent material 602 to continuously transmit and/or store the microwave field intensity from the one or more RF detectors.

While the foregoing is directed to embodiments of the present principles, other and further embodiments of the principles may be devised without departing from the basic scope thereof.

The invention claimed is:

1. An apparatus for characterizing microwave energy in a microwave chamber, comprising:
   a microwave transparent substrate having:
      at least one Radio Frequency (RF) detector that is configured to continuously detect microwave fields over at least one full gigahertz frequency range and to continuously generate at least one signal associated with a detected microwave field intensity; and
      a transmitter that receives the at least one signal associated with the detected microwave field intensity from the RF detector and transmits the detected microwave field intensity.

2. The apparatus of claim 1, wherein the transmitter transmits the detected microwave field intensity in real-time to a remote location outside of a microwave cavity.

3. The apparatus of claim 1, wherein the transmitter transmits the detected microwave field intensity in real-time over a transmission cable.

4. The apparatus of claim 1, wherein the at least one RF detector receives microwave fields in at least two dimensional planes.

5. The apparatus of claim 1, wherein microwave transparent substrate is permanently affixed inside a microwave cavity.

6. The apparatus of claim 1, further comprising:
   an analog to digital converter electrically coupled to the at least one RF detector that converts the signal associated with the detected microwave field into data, the analog to digital converter electrically coupled to the transmitter to provide the data to the transmitter.

7. The apparatus of claim 6, wherein the transmitter wirelessly transmits the data in real-time.

8. The apparatus of claim 6, further comprising:
   a memory electrically coupled to the transmitter, and wherein the transmitter stores the data on the memory.

9. The apparatus of claim 6, wherein the transmitter tags the data with a time tag or an identification before transmitting the data.

10. An apparatus for characterizing microwave energy in a microwave chamber, comprising:
    a microwave transparent substrate having:
       at least one Radio Frequency (RF) detector that is configured to continuously detect microwave fields over at least one full gigahertz frequency range and to continuously generate at least one signal associated with a detected microwave field intensity; and
       at least one light emitting diode (LED) electrically coupled to the at least one RF detector, wherein the at least one LED continually emits a visual indication of a microwave field intensity based on the at least one signal associated with the detected microwave field intensity of the microwave field received from the RF detector.

11. The apparatus of claim 10, further comprising:
    a camera remotely located from the microwave transparent substrate, wherein the camera monitors or records at least one visual indication from the microwave transparent substrate.

12. The apparatus of claim 10, wherein the at least one RF detector receives microwave fields in at least two dimensional planes and the at least one LED provides visual indication of a microwave field intensity for an associated dimensional plane.

13. A semiconductor processing chamber for processing semiconductors, comprising:
   a microwave cavity for processing semiconductor substrates, comprising:
      at least one microwave transparent substrate mounted internally to the microwave cavity, the microwave transparent substrate having:
         at least one Radio Frequency (RF) detector that is configured to continuously detect microwave fields over at least one full gigahertz frequency range and to continuously generate at least one signal associated with a detected microwave field intensity; and
         a transmitter that receives the at least one signal associated with the detected microwave field intensity from the RF detector and transmits the detected microwave field intensity.

14. The semiconductor processing chamber of claim 13, further comprising:
   an analog to digital converter electrically coupled to the at least one RF detector that converts the microwave field intensity detected by the RF detector into data, the analog to digital converter electrically coupled to the transmitter to provide the data to the transmitter.

15. The semiconductor processing chamber of claim 14, wherein the transmitter wirelessly transmits the data in real-time.

16. The semiconductor processing chamber of claim 14, further comprising:
   a memory electrically coupled to the transmitter, and wherein the transmitter stores the data on the memory.

17. The semiconductor processing chamber of claim 14, wherein the transmitter tags the data with a time tag or an identification before transmitting the data.

18. The semiconductor processing chamber of claim 13, wherein the at least one RF detector receives microwave fields in at least two dimensional planes.

19. The semiconductor processing chamber of claim 13, wherein at least one of the at least one microwave transparent substrate has an array of RF detectors to receive microwave fields in at least one dimensional plane.

20. The semiconductor processing chamber of claim 13, wherein the transmitter transmits the detected microwave intensity in real-time to a remote location outside of the microwave cavity.

* * * * *